United States Patent
Nöll

(10) Patent No.: US 8,227,052 B2
(45) Date of Patent: Jul. 24, 2012

(54) METHOD AND DEVICE FOR PLASMA-ASSISTED CHEMICAL VAPOUR DEPOSITION ON THE INNER WALL OF A HOLLOW BODY

(75) Inventor: Oliver Nöll, Schwalmstadt (DE)

(73) Assignee: Ralf Stein, Dortmund (DE)

( * ) Notice: Subject to any disclaimer, the term of this patent is extended or adjusted under 35 U.S.C. 154(b) by 716 days.

(21) Appl. No.: 12/373,415

(22) PCT Filed: Jul. 11, 2007

(86) PCT No.: PCT/EP2007/057117
§ 371 (c)(1),
(2), (4) Date: Jan. 12, 2009

(87) PCT Pub. No.: WO2008/006856
PCT Pub. Date: Jan. 17, 2008

(65) Prior Publication Data
US 2009/0280276 A1    Nov. 12, 2009

(30) Foreign Application Priority Data

Jul. 12, 2006 (DE) .......................... 10 2006 032 568

(51) Int. Cl.
*C23F 1/00* (2006.01)
*H05H 1/24* (2006.01)
*C23C 16/505* (2006.01)
(52) U.S. Cl. ........ 427/569; 427/230; 427/231; 427/232; 427/233; 427/234; 427/235; 427/237; 427/238; 118/622; 156/345.1; 156/345.51

(58) Field of Classification Search .................. None
See application file for complete search history.

(56) References Cited

U.S. PATENT DOCUMENTS

| | | | |
|---|---|---|---|
| 5,308,649 A | 5/1994 | Babacz | |
| 6,180,191 B1 | 1/2001 | Felts | |
| 2003/0143821 A1 | 7/2003 | Niino et al. | |

FOREIGN PATENT DOCUMENTS

| | | |
|---|---|---|
| DE | 3821815 | 1/1990 |
| DE | 42 42 894 | 6/1994 |
| DE | 4318084 | 12/1994 |
| DE | 19726443 | 6/1997 |
| EP | 1548149 | 6/2005 |
| JP | 2003237754 | 8/2003 |
| JP | 2003293135 | 10/2003 |
| JP | 2004196351 | 7/2004 |
| JP | 2005022727 | 1/2005 |

OTHER PUBLICATIONS

Takao, JP2005-022727, Jan. 2005, English machine translation of full document (abstract translation provided by applicants).*

* cited by examiner

*Primary Examiner* — Timothy H Meeks
*Assistant Examiner* — Joseph Miller, Jr.
(74) *Attorney, Agent, or Firm* — Occhiuti Rohlicek & Tsao LLP

(57) ABSTRACT

The invention relates to a method for plasma-assisted chemical vapour deposition for coating or material removal on the inner wall of a hollow body (42). The method involves introducing a gas lance (44) into the hollow body (42) and forming a cavity plasma (45) to form a plasma cloud arranged at the tip of the gas lance by applying an electric radio-frequency field to an RF electrode (41).

18 Claims, 10 Drawing Sheets

Figure 1:
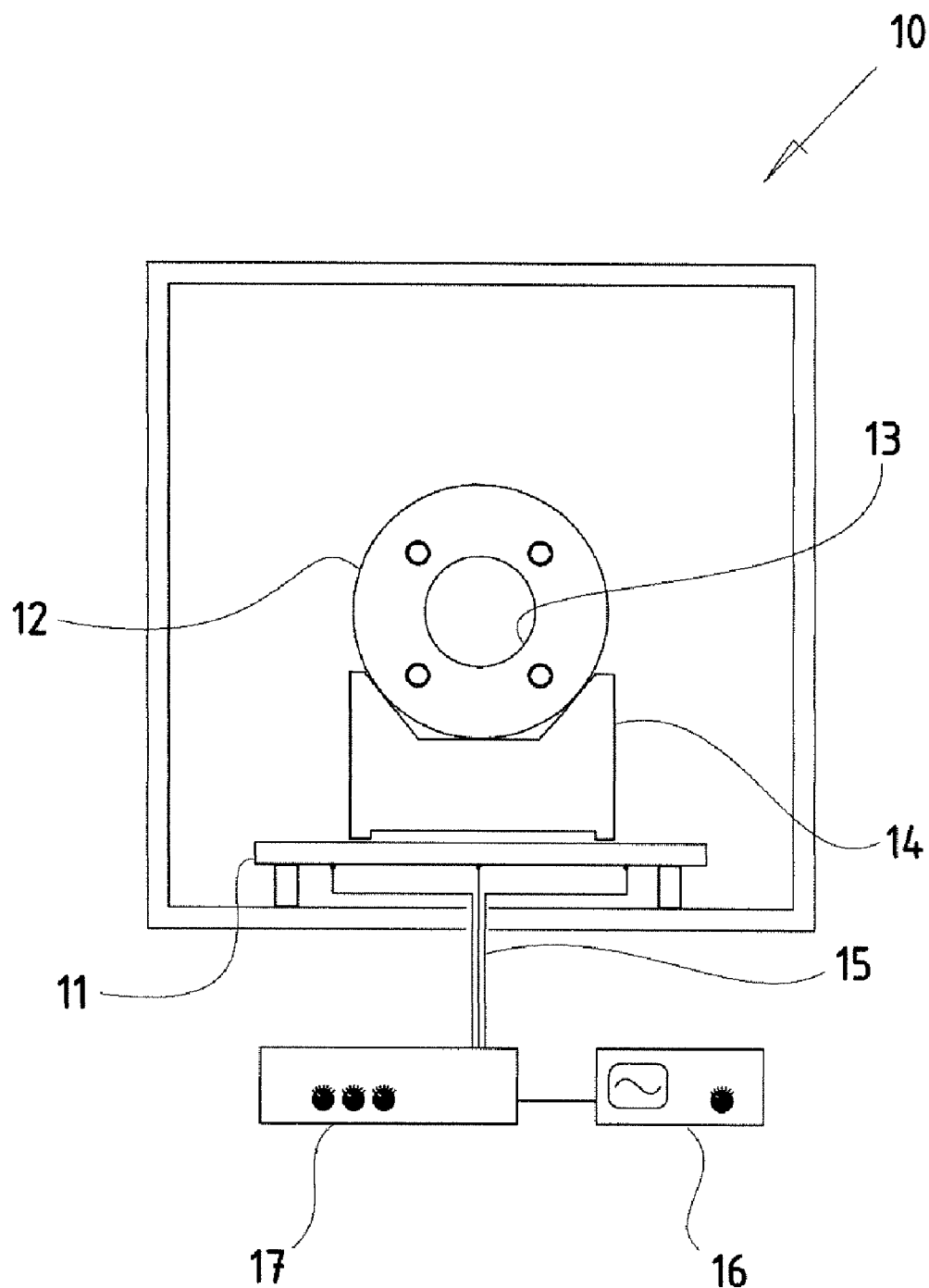

METHOD AND DEVICE FOR PLASMA-ASSISTED CHEMICAL VAPOUR DEPOSITION ON THE INNER WALL OF A HOLLOW BODY

CROSS-REFERENCE TO RELATED APPLICATIONS

This application is the National Stage of International Application No. PCT/EP2007/057117, filed on Jul. 11, 2007, which claims the priority of German Application No. 10 2006 032 568.0, filed on Jul. 12, 2006. The contents of both applications are hereby incorporated by reference in their entirety.

The invention relates to a method for plasma-assisted chemical vapour deposition for coating or material removal on the inner wall of a hollow body.

Such methods are known by the generic terms plasma coating (PECVD, "Plasma Enhanced Chemical Vapour Deposition") or ion etching and plasma etching.

In this context, a workpiece is introduced into a vacuum chamber and fixed there. The chamber is evacuated to a residual gas pressure in the high-vacuum or ultra high-vacuum range and an inert working gas is admitted. A low-pressure plasma is subsequently ignited by feeding in an RF field via an RF electrode arranged in the vacuum chamber. An ionized gas is produced in this case, said gas containing an appreciable proportion of rapidly moving free charge carriers such as ions or electrons.

In PECVD, besides the working gas further reaction gases, as they are called, are fed into the chamber, which gases can be, in particular, carbon-containing or silicon-containing gases. In the low-pressure plasma, the electrons have such high energies that chemical reactions between the gas constituents and constituents of the surface of the workpiece are possible which are not possible at thermal equilibrium. Layers form on the surface of the workpiece in this way, which layers can comprise carbon or silicon oxide, for example, depending on the reaction gas. It is thus possible for example to produce high-strength, low-friction and biocompatible diamond-like carbon (DLC) coatings which are used e.g. in implants, gearwheels and the like.

Ion etching and plasma etching, by contrast, involve removing material from the surface of the workpiece in order e.g. to clean the latter. For this purpose, the ions of the low-pressure plasma generated have to have a certain minimum energy. The acceleration of argon ions in the high vacuum in the direction of the substrate to be processed has the effect that, upon impingement, momentum is transferred from the high-energy ions to the substrate and the surface of the latter is sputtered and removed uniformly.

In plasma etching, moreover, the etching is effected by a chemical reaction. In this case, instead of pure argon a reactive gas such as oxygen, for example, is fed to the plasma.

Both PECVD and also ion etching and plasma etching have proved to be extremely worthwhile in the surface treatment of workpieces. However, at least when a plasma is generated by radio-frequency excitation, neither of these methods is suitable for coating or for etching the inner surfaces of hollow bodies such as e.g. containers, bottles, tubes, cannulas, bores and the like.

This is due to the fact that conductive hollow bodies form a Faraday cage in the electric field. The ions produced are oriented according to the field lines of said electric field. Since these run along and around the outer wall of the hollow body but not through its inner volume, an inner coating is not physically possible in a straightforward manner. In order to circumvent this effect, the plasma has to be brought into the inner volume of the hollow body. In this case, a negative area replacing the role of the inner wall of the chamber as negative area would have to be introduced into the inner volume. In this case, the size of the negative area must in principle be at least twice as large as the surface to be coated, in order to ensure a deposition sufficient for the layer construction.

Accordingly, it is practically not possible to comply with this principle within a hollow body.

In the case of a cylindrical hollow body, by way of example, the inner surface area of the cylinder wall is $A=2\pi rh$. A planar electrode, set up perpendicularly in the hollow body, could have at most a surface area of $2 rh$, however, that is to say would be smaller than the surface to be coated by a factor of 3.14 rather than being twice as large according to the technical requirement.

Similar relationships hold true for other hollow bodies such as e.g. cones and truncated cones or complexly shaped hollow bodies.

DE 197 26 443 describes a method for surface refinement of inner surfaces of hollow bodies in which the plasma is ignited by a hollow cathode corona discharge. What is disadvantageous here is that only relatively short hollow bodies in which the depth does not exceed the opening diameter can be coated from the inside. A variant that enables longer hollow bodies to be coated on the inside provides for the hollow cathode to be inserted into the hollow body and to run along the inner side. Thus, although longer hollow bodies can be coated on the inside, they nevertheless have to have a rectilinear wall course.

EP 1 548 149 describes a method for forming a thin oxide coating on the inner side of a hollow body. In this case, a hollow body to be coated on the inner side is introduced into a cylindrical chamber that functions as an RF electrode. A gas tube, which simultaneously functions as an earth electrode, is introduced into the interior of the hollow body.

The disadvantage of this method resides in the formation of the layer properties. The gas tube functions as an earth electrode in the device described in EP 1 548 149. For this reason, the layer properties (hardness, thickness, lattice structure of the deposition, purity of the layer, doping with functional elements, water-repelling or -absorbing) cannot be established as desired.

It is not possible to establish and control these properties in the case of an introduced earth electrode which, with respect to its area, is smaller by a factor of 1 than the area to be coated.

DE3821815 discloses a device for coating an inner wall of a hollow body with a diamond-like hard carbon coating with the aid of a plasma-assisted CVD method. In this case, a process gas containing at least one hydrocarbon gas is conducted through the interior of the unheated hollow body, in which a plasma excites the process gas, wherein it is dissociated and ionized and the resulting ions, for forming the coating, are accelerated onto the inner wall to be coated. The device has an RF generator connected to the hollow body, with an earthing arrangement for forming the plasma between the hollow body and the earthing arrangement and with a feed line opening into the interior of the hollow body for the controlled introduction of the process gas into the interior of the hollow body. The earthing arrangement is connected to a vacuum housing into which the interior of the hollow body leads and which surrounds the hollow body at a distance from the lead-in junction.

This device has proved to be unsuitable in practice, for various reasons. Thus, in the method carried out with this device, not only the inner wall of said hollow body but also the outer wall thereof is coated. Furthermore, this device is only suitable for the coating of hollow bodies having a rectilinear inner course (so-called "blind holes"), that is to say e.g. not for container-like vessels having a narrowed neck.

An additional factor is that in this device the hollow body itself functions as an electrode since it is conductively connected to the radio-frequency electrode. This is necessary in this device since otherwise the field strength of the electromagnetic alternating field generated would not suffice to ensure an inner coating. The penetration depth of an electromagnetic alternating field generated only by the radio-frequency electrode in the base region of the vacuum chamber (that is to say the maximum thickness of an if appropriate metallic material through which the alternating field penetrates with sufficient strength still to initiate a coating reaction) is in the region of 2 cm in this device. Therefore, in this device, hollow bodies having a larger wall thickness have to rely on the fact that they themselves function as an electrode; therefore, they must necessarily be composed of metal.

Furthermore, it has been found that the geometries of the hollow bodies to be coated are very limited. Thus, despite describing that besides workpieces having a ratio of tube diameter to tube length in the range of between 20 mm to 60 mm and 2 mm to 20 mm, tube diameters of greater than 20 mm and less than 2 mm, respectively, can also be coated with this device, this has been found to be problematic in practice.

Therefore, the abovementioned method is not suitable for a large number of applications in which hollow bodies having a larger internal diameter are intended to be coated.

It is an object of the present invention to provide a method for plasma-assisted chemical vapour deposition for coating or material removal on the inner wall of a hollow body which does not have the disadvantages mentioned.

This object is achieved by means of a method having the features described hereinbelow.

It should be taken into account here that value ranges delimited by numerical values should always be understood as inclusive of the relevant numerical values.

Accordingly, provision is made of a method for plasma-assisted chemical vapour deposition for coating or material removal on the inner wall of a hollow body, in particular composed of a non-metallic material, having a cross-sectional area, a longitudinal extent and at least one opening. The method has the following steps:
1. introducing the hollow body to be coated on its inner side into a vacuum chamber with an earthed inner side, a large-area radio-frequency electrode being arranged in the interior of the vacuum chamber,
2. positioning the hollow body in the centre of the vacuum chamber, it being necessary to comply with a minimum distance of 15 cm on all sides between the outer wall of the hollow body and the inner wall of the vacuum chamber,
3. introducing a gas lance comprising a tube having an internal diameter of 0.001-10 mm, a maximum external diameter of 12 mm and a terminal nozzle having a terminal opening diameter of 0.002-6 mm through the opening into the hollow body, the gas lance being connected to a gas feed unit via a non-electrically conductive line and, in particular, not being earthed or being in electrically conductive contact with the radio-frequency electrode,
4. positioning the gas lance in the hollow body in such a way that the gas lance is positioned centrally relative to the cross section of the hollow body and the nozzle of the gas lance, relative to the longitudinal extent of the hollow vessel, is arranged in the region of the transition from the second longitudinal third to the third longitudinal third, measured from the opening of the hollow body,
5. closing the vacuum chamber and evacuating the latter to a residual pressure of 0.001-5 pascals,
6. introducing an inert working gas and also one or a plurality of reaction gases via the gas feed unit and the gas lance into the hollow body, and
7. igniting a cavity plasma to form a plasma cloud arranged at the tip of the gas lance, by applying an electric radio-frequency field to the RF electrode.

It is relevant here that the hollow body to be coated is not earthed. It is preferably provided here that the vacuum chamber is evacuated to a residual pressure of 0.01-2 pascals. Particularly preferably, the vacuum chamber is evacuated to a residual pressure of 0.1-1 pascal.

What is important in this method is that the gas lance is not grounded or earthed, but rather is electrically insulated. For this purpose, it is preferably provided that said gas lance is insulated with the aid of a PTFE ring (polytetrafluoroethylene) and the gas supply line within the chamber interior is produced from PTFE. Suitable hollow bodies to be coated include, in principle, all possible hollow bodies, that is to say not only hollow bodies closed on one side (such as e.g. vessels, containers, etc.) but also tubular hollow bodies without a base, such as e.g. cannulas, bodies having a through hole or tubes. The latter hollow bodies have to be closed off with a cover or stopper on one side prior to coating.

In both cases care must be taken to ensure that the gas lance is arranged in the hollow body in such a way that the gas lance is positioned centrally relative to the cross section of the hollow body and the nozzle of the gas lance, relative to the longitudinal extent of the hollow vessel, is arranged in the region of the transition from the second longitudinal third to the third longitudinal third, measured from the opening of the hollow body. This means that the gas lance has to be advanced to relatively just before the bottom of the vessel (or before the second opening of the hollow body closed off with a cover or stopper). A minimum distance of 10 cm has to be complied with here. In the case of substrate objects having a depth of 10 cm or less, the tip of the gas lance is positioned directly above the opening of the hollow body.

In principle, low-pressure plasmas as in the present invention ensure a larger mean free path length λ of the gas molecules and therefore delay the formation of a plasma. The arrangement of the gas lance according to the invention has the effect, by contrast, that the gas molecules emerging from the gas lance collide with the bottom of the vessel or the abovementioned cover or stopper as a result of their acceleration. This promotes the gas dissociation process and the formation of a plasma. For this reason, a comparatively lower strength of the electromagnetic alternating field is sufficient, that is to say that it is not necessary for the hollow body that is to be coated itself to function as an electrode.

Preferably, the minimum distance between the outer wall of the hollow body and the inner wall of the vacuum chamber is 15 cm. The maximum distance, by contrast, is given by the dimensioning of the vacuum chamber used.

The gas lance has preferably an internal diameter of 0.005-6 mm and particularly preferably an internal diameter of 0.01-6 mm or 0.1-6 mm and a maximum external diameter of 10 or 8 mm. The terminal nozzle preferably has a terminal opening diameter of 0.01-3 or 0.1 to 2 mm.

The arrangement and dimensioning of the gas lance ensure that the plasma forms only at the tip of the gas lance, i.e. only in the interior of the hollow body to be coated. Since the gas molecules experience their greatest acceleration at the instant of the plasma-induced dissociation, this acceleration fully benefits the treatment of the inner surface of the hollow body. Therefore, it is also possible to dispense with an electrode in the interior of the hollow body.

In this way, a plasma is enabled to be ignited and maintained only in the interior of the hollow body. This type of plasma is referred to as "cavity plasma" hereinafter. This ensures that said hollow body is coated only on the inner side and not on its outer side.

The plasma-induced molecular dissociation takes place at the instant at which the gas mixture leaves the lance nozzle. It takes place with the formation of very short-wave light.

The splitting energy released during dissociation accelerates the what is now truly "plasma matter" to approximately 250,000 km/h. On account of this acceleration, the carbon impinges on the inner surface to be coated and deposits as a hard material layer. The type of deposition varies depending on the gas used and the purity and composition thereof.

The dissociation ratio is 1:12 e.g. in the case of $H_2C_2$. This means that the H atoms are 12 times lighter than the C atoms. The acceleration of the dissociation plus the acceleration of the individual atoms and the impingement on the substrate are therefore in the ratio of 1:12.

Therefore, twelve times more C atoms than H atoms at the same velocity impinge on an identical area in the same period of time. Since the H atoms are undesirable in a hard material layer, the quantity of reaction gas fed in has to be calculated with regard to the inner area to be coated.

The following relationship determined empirically by the inventor can be used for calculating the quantity of reaction gas to be fed in:

$$V = A/12 * E$$

In this case, A is the surface area to be coated [$cm^2$], E is the dissociation energy supplied, and V is the volume of the reaction gas per minute [$cm^3$/min].

On account of the mass inertia and the dissociation energy released, the carbon therefore requires less area per acceleration free space in order to arrive at the required 250,000 km/h.

If the $H_2C_2$ is introduced in a three-dimensional hollow body by means of a gas lance, then it must be ensured that the C atoms impinge directly on the substrate at maximum acceleration and are not deflected, decelerated or even stopped by equivalently accelerated H atoms.

This is ensured by virtue of the fact that the nozzle of the gas lance, relative to the longitudinal extent of the hollow vessel, is arranged in the region of the transition from the second longitudinal third to the third longitudinal third, measured from the opening of the hollow body. As a result, the atoms are accelerated up to their maximum and impinge on the substrate directly at the end of this phase without being impeded by other atoms.

Investigations by the inventor have revealed moreover, that in order to ensure the abovementioned deposition on the inner surface of a hollow body, the dissociation energy ($E_A$) in watts must be higher than the opening diameter ($D_Ö$) of the hollow body in cm at least by the factor 65.5.

This means, therefore, that given an opening diameter ($D_Ö$) of the hollow body of 15 cm, the dissociation energy ($E_A$) on the basis of the relationship $$E_A = D_Ö * 65.5$$

must be at least 15*65.5=982 watts.

By introducing this minimum dissociation energy, which can be correspondingly established at the RF generator, the atoms of the reaction gas that has undergone transition to the plasma are accelerated in such a way that their oscillation amplitude is larger than the opening diameter of the hollow body. This ensures that only transversely accelerated atoms can leave the hollow body.

In this way, contrary to the statements in the introduction, the inner surface of a hollow body can also be coated by means of the method according to the invention.

In this case, the dimensioning of the nozzle of the gas lance prevents the plasma from flashing back into the gas lance as would be feared with nozzles having larger dimensions.

It is also important that the diameter of the gas lance does not widen in the direction of the nozzle. As a result of this, on account of the Bernoulli effect, the pressure of the incoming gas would decrease in the flow direction in the region of the cross-sectional widening, which would promote a flashback of the plasma into the gas lance and thus destruction of the gas lance. The formation of the plasma cloud at the tip of the gas lance would be prevented in this way.

In one preferred configuration of the method according to the invention, it is provided that the radio-frequency electrode in the interior of the vacuum chamber has at least two leads via which radio-frequency voltages can be fed into the radio-frequency electrode.

In this way, an alternating field having very high field strengths such as is required for forming the cavity plasma can be generated in the chamber. An alternating field generated in this way has a sufficiently high penetration depth, such that even hollow bodies having large wall thicknesses can be penetrated and coated on the inner side. The hollow body itself therefore does not have to function as an electrode and can therefore also be composed of a non-metallic material. It is therefore irrelevant whether the hollow body is in electrically conductive contact with the radio-frequency electrode or whether it is completely electrically insulated.

This feature is advantageous particularly with the property that in the method according to the invention the temperatures in the interior of the coating chamber generally do not exceed 200° C. On account of these low temperatures, therefore, even plastic hollow bodies can be provided with an extremely durable inner coating. This is advantageous particularly because, on account of the unrequired electrically conductive connection between the hollow body and the radio-frequency electrode, non-metallic hollow bodies can indeed also be coated by the method according to the invention.

In this case, three or more leads are preferably provided since an even more homogeneous alternating field can be established in this way.

In this case, it is preferably provided that the individual leads to the radio-frequency electrode are adjusted separately in such a way that a homogeneous alternating field having uniformly high field strengths can be generated in the entire chamber. This feature benefits the coating quality.

This can be effected by means of a so-called matchbox, for example, which is connected between a radio-frequency generator and the radio-frequency electrode. This has e.g. trimming potentiometers for the individual leads to the radio-frequency electrode which are adjusted separately. In this case, the same bias voltage is set at all the regulators, which indicates identical field strengths and thus a homogeneous alternating field.

In a further preferred configuration of the method according to the invention it is provided that said hollow body merely has an opening whose narrowest diameter is narrower than the narrowest diameter of the inner space of the hollow body. Such a hollow body can be e.g. a bulk container, a bottle or the like. Hollow bodies having such geometries cannot be coated in particular by the method known from DE3821815.

Furthermore, it is preferably provided that said hollow body to be coated has an inner volume in the range of between a few $cm^3$ and 1,000,000 $cm^3$. For technical reasons, a limit is imposed on the size of the hollow body to be coated only because the size of the vacuum chambers currently available is limited.

Thus, e.g. a bulk container has an inner volume in the range of 10,000-100,000 cm$^3$. An engine block having four cylinders has e.g. four inner volumes in the range of between 250 and 700 cm$^3$. A gas cylinder has e.g. an inner volume in the range of 20,000-100,000 cm$^3$.

Here, too, it holds true that hollow bodies having such volumes cannot be coated with sufficient quality in particular by the method known from DE3821815.

It is preferably provided that the working gas is a gas selected from the group containing argon, helium, hydrogen, oxygen or some other noble gas.

Furthermore, it is particularly preferably provided that the reaction gas is a gas selected from the group containing oxygen.

Such a method for plasma-assisted chemical vapour deposition for material removal is also referred to as plasma etching. Oxygen is particularly suitable as a reaction gas for this method since the oxygen ions produced in the plasma are particularly heavy and therefore bring about surface removal particularly effectively in the accelerated state.

Investigations by the applicants have revealed that e.g. the inner surface of a used bulk container such as is used e.g. for the production of vaccines and which is extremely contaminated after use by dried-in and/or chemical blood constituents can be cleaned extremely thoroughly by this method.

Pursuant to applicable regulations, e.g. a high-grade steel for medical use must be absolutely free of residues of previous substances in contact with it. This has been achieved hitherto in the case of bulk containers, for example, by means of a very costly cleaning process using acids and alkaline solutions.

The method according to the invention, in which a plasma is ignited after oxygen has been fed with supply of high energy, makes it possible to clean ("etch") the surface of the substrate in a manner absolutely free of residues. This can be attributed in particular to the high atomic weight of the oxygen atoms, which reliably remove contaminants upon sufficient acceleration.

In a further preferred configuration of the method according to the invention, it is provided that the reaction gas is a gas selected from the group containing hydrocarbon gases such as methane, ethane, ethene, ethyne, propane or silane gases such as tetramethylsilane or hexamethyldisiloxane.

The former reaction gases are suitable for forming a DLC layer and the latter e.g. suitable for forming an SiO$_2$ layer.

The term DLC ("Diamond-Like Carbons") is understood to mean layers of molecular carbon which have a net or lattice of sp$^2$- and sp$^3$-hybridized carbon atoms. The ratio of the two variants to one another depends on the coating conditions. If the former predominate, the coating has graphite-like properties (low coefficient of friction), and if the latter predominate, the hardness and the transparency of the coating increase. Mixed coatings containing both variants frequently combine both advantages.

Investigations by the applicants have revealed that the inner surfaces of bulk containers and other hollow bodies can be effectively coated with a DLC layer by this method.

Preferably, in the method according to the invention, the plasma is ignited by applying a DC voltage radio-frequency field with the following parameters:
1. frequency: 10 kHz-100 GHz
2. electrical power: 500-5000 W
3. gas feed: 0-90 scm$^3$.

The frequency preferably lies in the range of 10-15 MHz. The frequency is particularly preferably 13.56 MHz (RF, radio-frequency).

The electrical power to be introduced is calculated according to the following formula: power (watts)=area to be coated (m$^2$)×1750. In this case, the factor mentioned last can lie between 1500 and 2200 and is determined empirically in practice. A hollow body having an inner surface area to be coated of 0.85 m$^2$ would accordingly have to be coated with a power of approximately 1500 watts.

Surprisingly, the bias voltage established under these conditions is in the region of 0 V, to be precise on all the leads. Moreover, this value is independent of whether or not the hollow body to be coated is in electrically conductive contact with the radio-frequency electrode.

The gas feed is regulated in a gas-specific manner and adjusted in a range of 0-90 sccm depending on the object and desired layer properties. It is preferably provided here that the quantity of reaction gas to be introduced for the coating is 0.1-10 sccm of reaction gas per 10 cm$^2$ of inner surface area to be coated.

The unit sccm denotes standard cubic centimeter, i.e. the volume of the gas to be introduced in cubic centimeters per minute (volume per minute). A valve with a mass flow controller is used for the adjustment. At a given pressure of the gas supply line, therefore, the opening state of the valve governs the inflowing volume per minute.

In the case of hydrocarbon gases it holds true that the layer becomes all the harder, the more gas is used since the proportion of available carbon atoms increases.

In the case of silane gases, by contrast, it holds true that the ratio of the silane gas to oxygen determines the hardness of the layer. For hard coatings, the ratio is e.g. 100 sccm HMDSO (hexamethyldisiloxane) to 400 sccm oxygen. By contrast, a reduction of the oxygen proportion leads to softer layers.

Particularly preferably, the quantity of the reaction gas to be introduced is 0.5-5 sccm of reaction gas per 10 cm$^2$ of inner surface area to be coated.

Furthermore, it is preferably provided that the reaction gas is doped with one or more gases containing Si, N, F, B, O, Ag, Cu, V or Ti. These dopants can contribute to having a targeted influence on the properties of the coating applied. Thus, e.g. the doping of the reaction gas with a gas containing Si (e.g. hexamethyldisiloxane) leads to a reduction of friction even under moist conditions and also to a higher thermal stability. A doping with N, F, B or O influences the surface tension, the wettability and the hardness of the coating. A doping with metals contributes to influencing the conductivity of the coating, while a doping with Ag, Cu, V or Ti influences the biological behaviour of the coating, in particular the biocompatibility which is hugely important e.g. for implants.

Layer growth rates of up to 4 μm/h and layer thicknesses of up to 7 μm are achieved with the method according to the invention.

The invention furthermore provides a hollow body having an inner surface, characterized in that the latter was treated by the method described above in such a way that a material removal was performed on the inner surface and/or the latter was provided with a coating. The coating can be, as mentioned above, e.g. a DLC, TiOx or SiO$_2$ coating.

Particularly preferably, said hollow body is a hollow body selected from the group containing vessels, bottles, containers, cannulas, hollow needles, syringes, inner walls of cylinder or piston bores in internal combustion engines, inner sides of bearings, in particular ball or rolling bearings.

The hollow bodies mentioned can comprise non-metallic materials, in particular, since the hollow body—in contrast to the description in DE 3821815—does not function as an electrode. This opens up new possibilities in lightweight construction. Thus, it is possible, for example, to produce a highly loaded metallic workpiece—thus e.g. an engine block of an internal combustion engine—from a plastic and to coat the inner walls of the cylinder bores with a surface having a high loading capability in a manner according to the invention.

The following advantages, inter alia, can be achieved with the method according to the invention:

a) improved cleaning of three-dimensional hollow bodies, in particular bulk containers, in conjunction with a reduced outlay;
b) improved corrosion protection of the coated surfaces;
c) no diffusion of a substrate situated in the hollow body into the inner surface layer of the hollow body;
d) reduction of the coefficient of friction of the inner surface; and
e) improved heat dissipation.

The invention furthermore provides a device for carrying out the method described above.

The present invention is elucidated in greater detail by the figures shown and discussed below. It should be taken into account here that the figures are only descriptive in nature and not intended to restrict the invention in any form.

FIG. 1 shows a section through a vacuum chamber 10 according to the invention in frontal view with a radio-frequency electrode 11 arranged at the bottom of the chamber, a hollow body 12 to be coated on the inner side and having an opening 13, said hollow body being arranged by way of a mount 14 on the radio-frequency electrode.

The radio-frequency electrode 11 in the interior of the vacuum chamber 10 has three leads 15 via which radio-frequency voltages generated by a radio-frequency generator (RF generator) 16 are fed into the radio-frequency electrode 11. By means of a regulable matchbox 17, as it is called, connected between the RF generator 16 and the radio-frequency electrode 11, the individual leads to the radio-frequency electrode 11 can be adjusted separately with the aid of trimming potentiometers in order to generate a homogeneous alternating field having uniformly high field strengths in the entire chamber.

Figure 2:
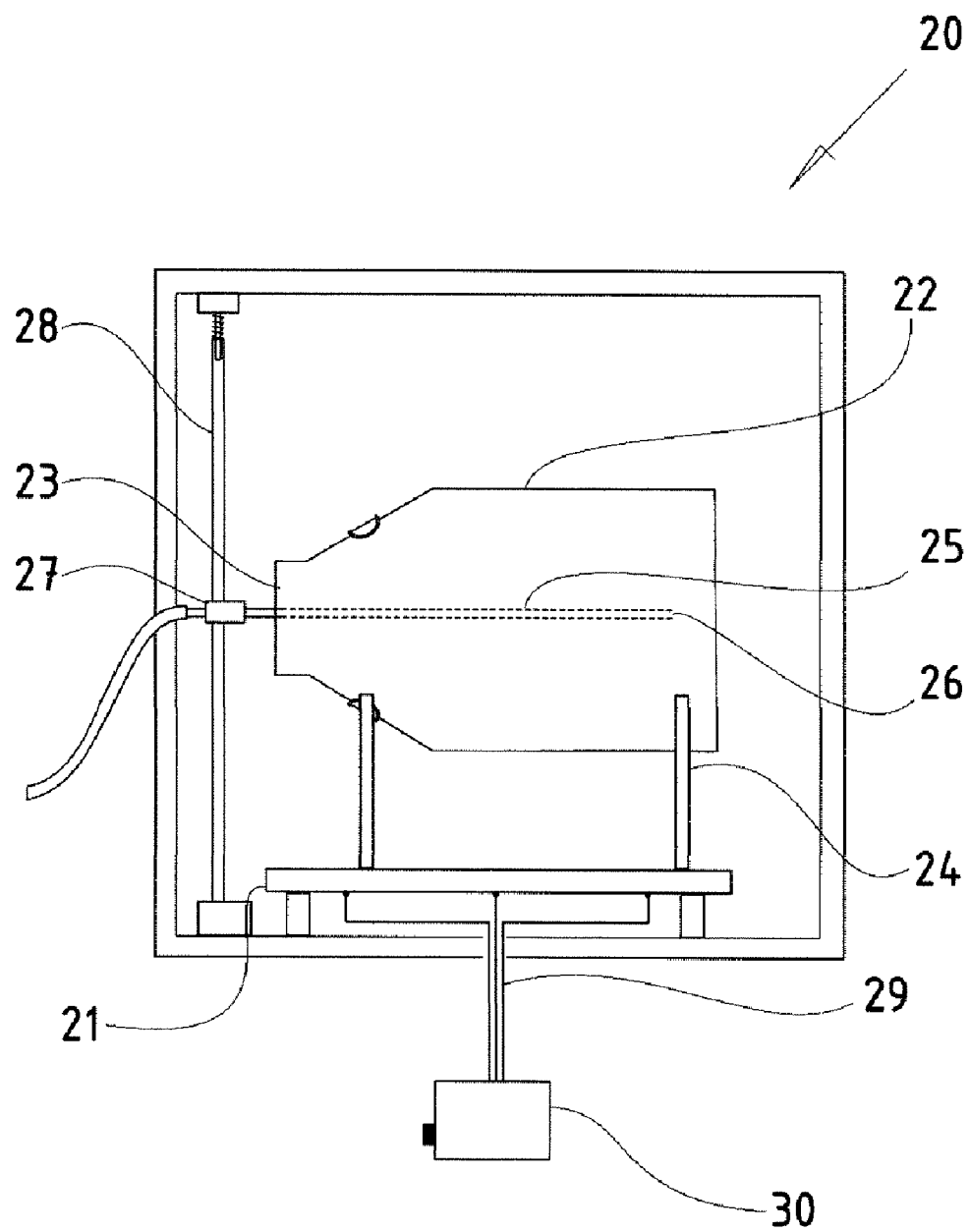

FIG. 2 shows the same vacuum chamber 20 in a lateral sectional view, with the radio-frequency electrode 21, the hollow body 22 to be coated on the inner side in plan view with an opening 23, and also the mount 24, which is not electrically conductive. The hollow body is a bulk container in the example shown. A gas lance 25 is inserted into the hollow body through the opening 23 of the hollow body, said gas lance having a terminal nozzle 26 having a diameter of 0.6 mm at its distal end. The gas lance is connected to a gas supply (not illustrated) via a hose and is guided via a height-adjustable mount 27, by means of which it can be ensured that the gas lance can be positioned in the hollow body 22 in accordance with the dimensioning described above. For this purpose, the mount is arranged on a carrier 28 in height-adjustable fashion.

The radio-frequency electrode 21 in the interior of the vacuum chamber 20 has three leads 29 via which radio-frequency voltages generated by a radio-frequency generator (RF generator) 30 are fed into the radio-frequency electrode 21. The individual leads to the radio-frequency electrode 21 can be adjusted separately via a regulable matchbox (not illustrated) connected between the RF generator 16 and the radio-frequency electrode 11.

Figure 3:
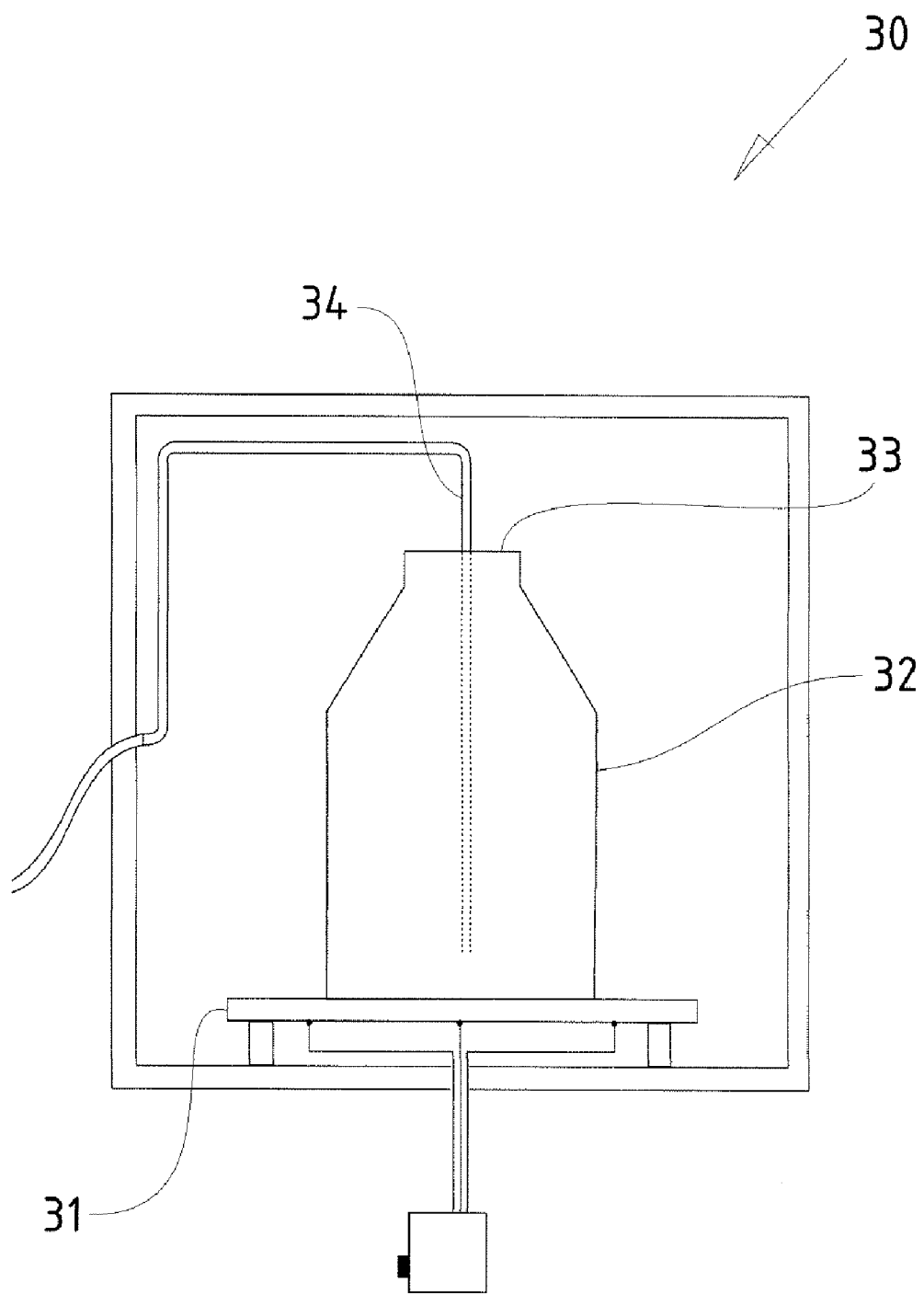

FIG. 3 again shows a vacuum chamber 30 in a lateral sectional view, with a radio-frequency electrode 31, a hollow body 32 to be coated on the inner side and arranged upright in plan view with an opening 33, through which a gas lance 34 is introduced into the hollow body. In the example shown, the hollow body is a bulk container composed of high-grade steel. Thus, in contrast to the embodiment shown in FIG. 2, the hollow body is electrically conductively connected to the radio-frequency electrode 31, and therefore likewise functions as an electrode.

Figure 4:
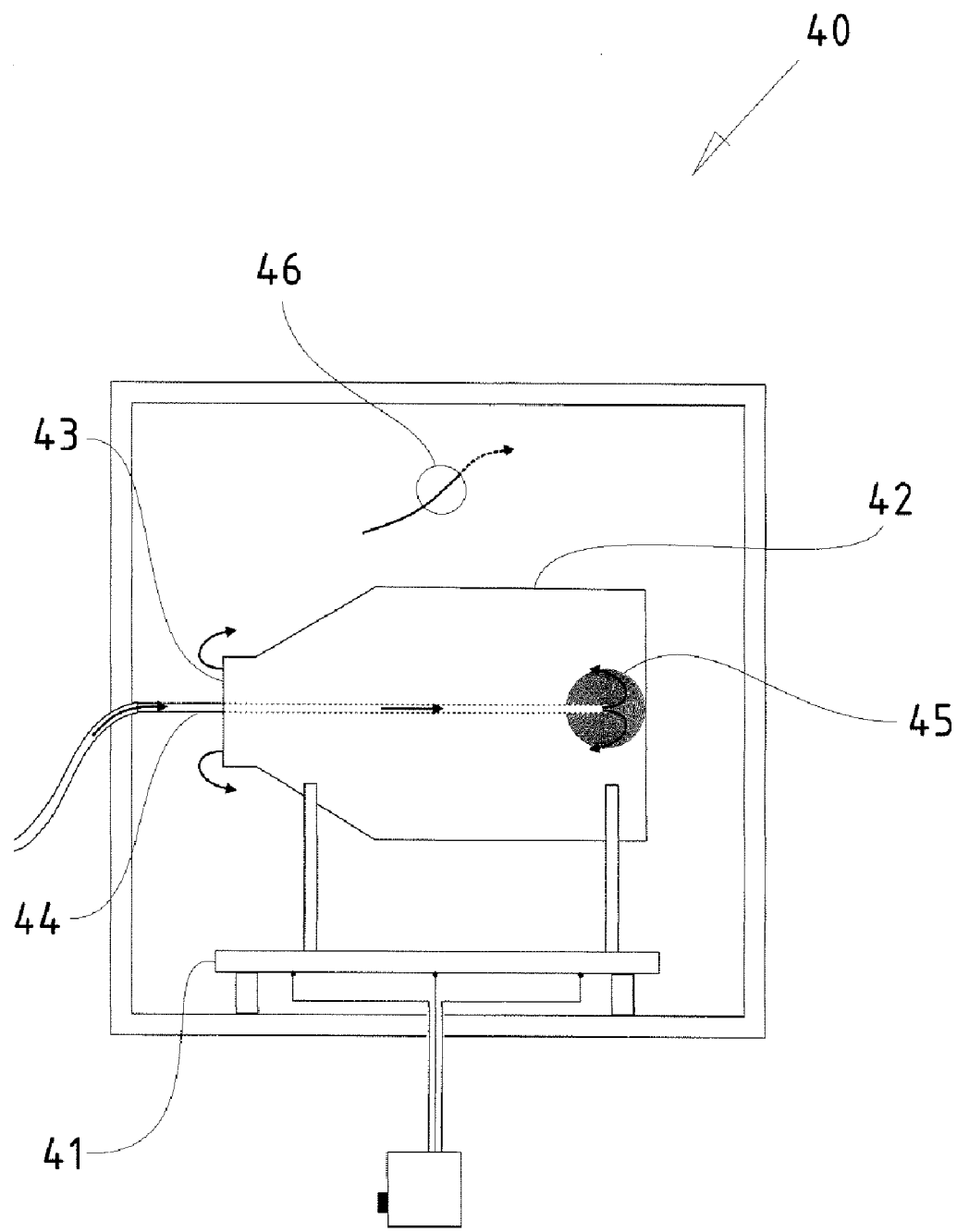

FIG. 4 shows the same vacuum chamber 40 as FIG. 2, with the radio-frequency electrode 41, the hollow body 42 to be coated on the inner side in plan view with an opening 43, through which a gas lance 25 is introduced into the hollow body. An electromagnetic alternating field is set [values, three leads, very homogeneous field] at the radio-frequency electrode and gas flows into the hollow body through the gas lance. On account of the electromagnetic interactions, the gas molecules that emerge are accelerated and a spherical plasma 45 is formed, which is also referred to as a cavity plasma since it essentially remains within the hollow body and does not pass into the actual vacuum chamber 40. The coating effects described above are established here on account of the plasma. On account of the via the suction-extraction connector 46, the outflowing gas or plasma is sucked in the direction of the opening 43.

Figure 5:
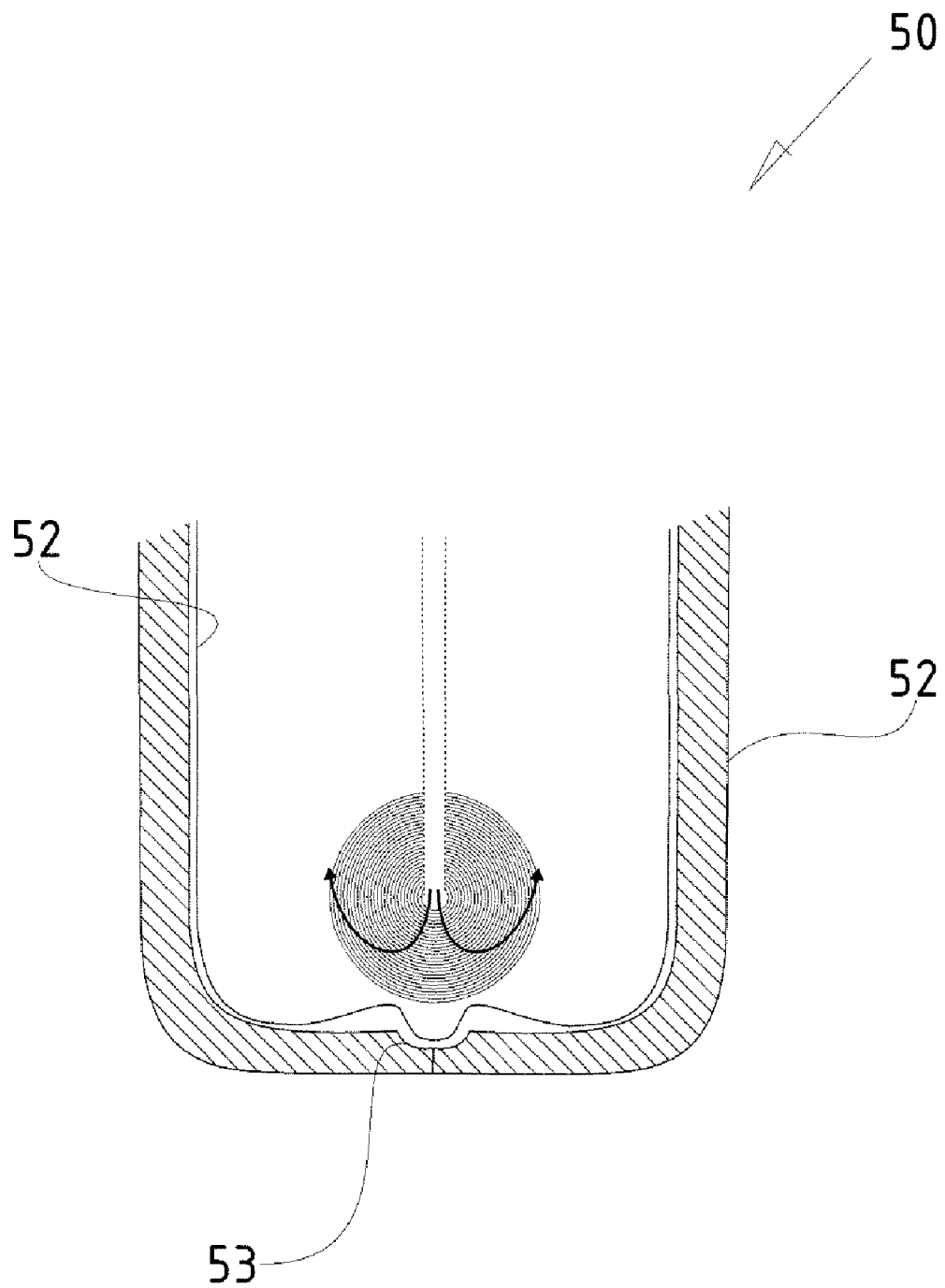

FIG. 5 shows a coated bulk container 50 in cross section with a wall 51 and the coating 52. The bulk container has a depression 53 in the region of its bottom. Moreover, the gas lance shown in the previous figures and the spherical plasma that is formed are illustrated schematically. It can be discerned that the coating applied on account of the effects of the spherical plasma has a greater thickness particularly in the region of the exit opening of the gas lance than in the edge regions of the container bottom or on the inner walls of the container. The thickness of the coating is greatly exaggerated in the illustration; in practice, it varies in the range of between 50 nm and 20 µm.

When the bottom of the container is viewed directly by an observer, this thickness gradient is discernible by virtue of the iridescent colour caused by interferences with the waves of the visible light spectrum (350-800 nm).

Figure 6:
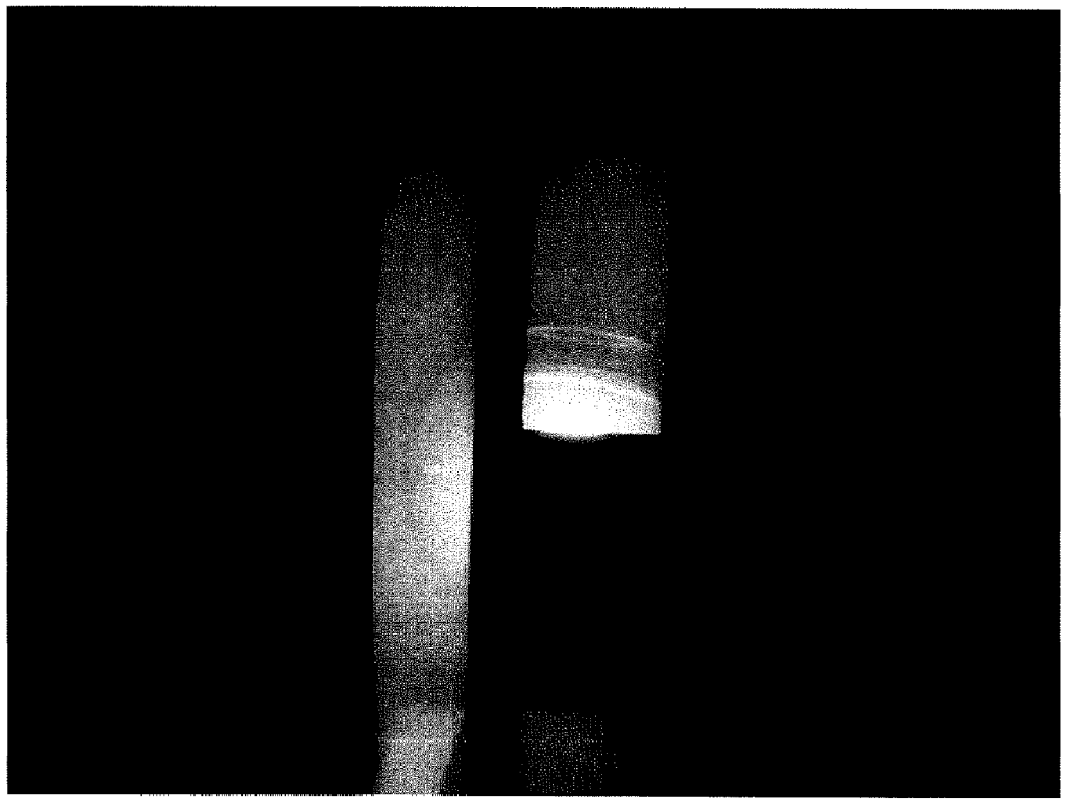

FIG. 6 shows the coating process under way on a horizontally arranged bulk container. For this purpose a photograph was taken through the porthole of the chamber in the direction of the opening of the bulk container. It can be discerned that the plasma formed burns only in the interior of the container, and not for instance in the entire chamber as known in devices from the prior art. The cavity plasma discussed above is involved here.

Figure 7:
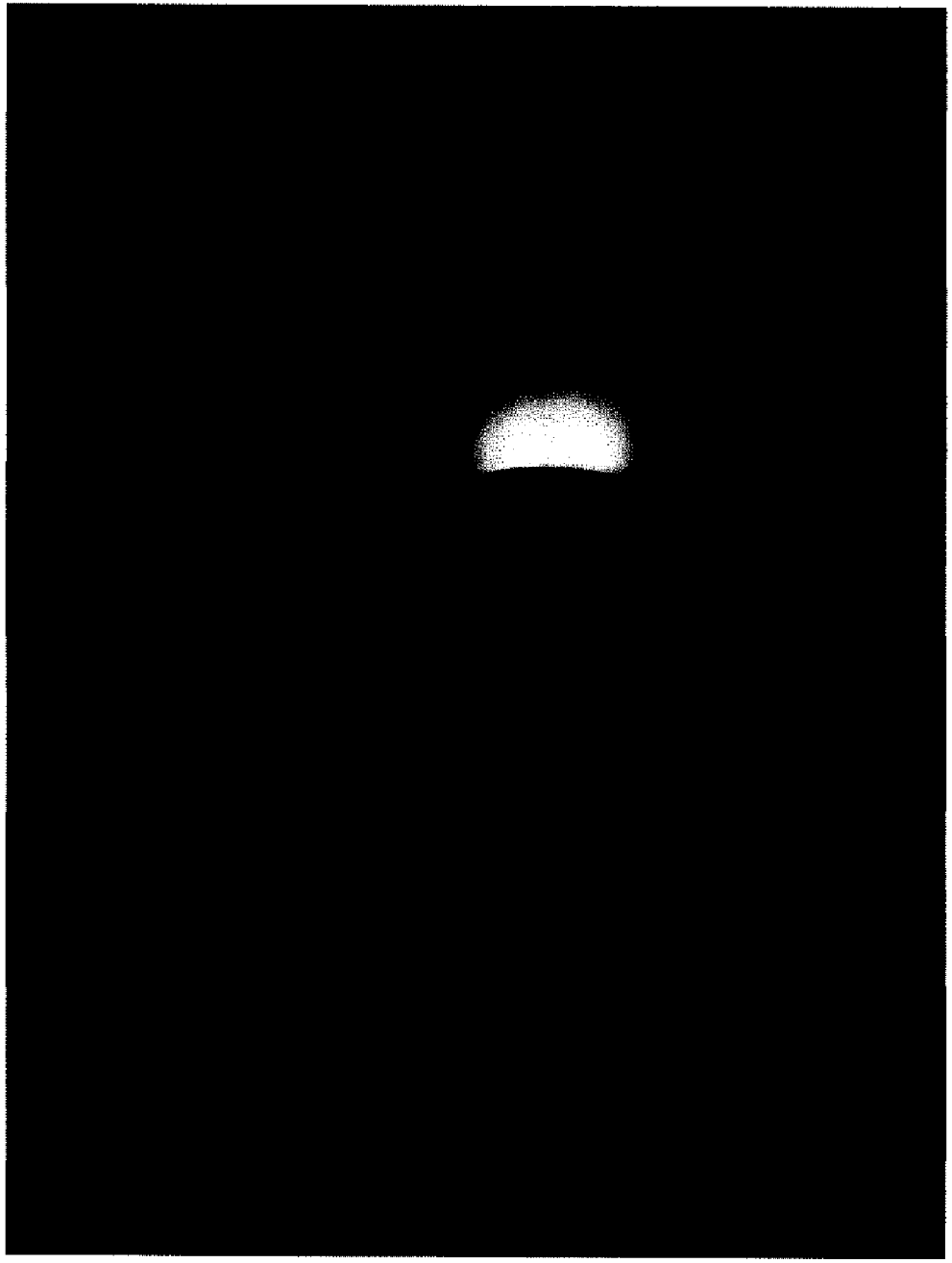

FIG. 7 shows the coating process under way on a vertically arranged bulk container. For this purpose a photograph was taken through the porthole of the chamber in the direction of the opening of the bulk container. Here, too, it can be discerned that the plasma formed burns only in the interior of the container, and not for instance in the entire chamber as known in devices from the prior art. The cavity plasma discussed above is involved here.

Figure 8:
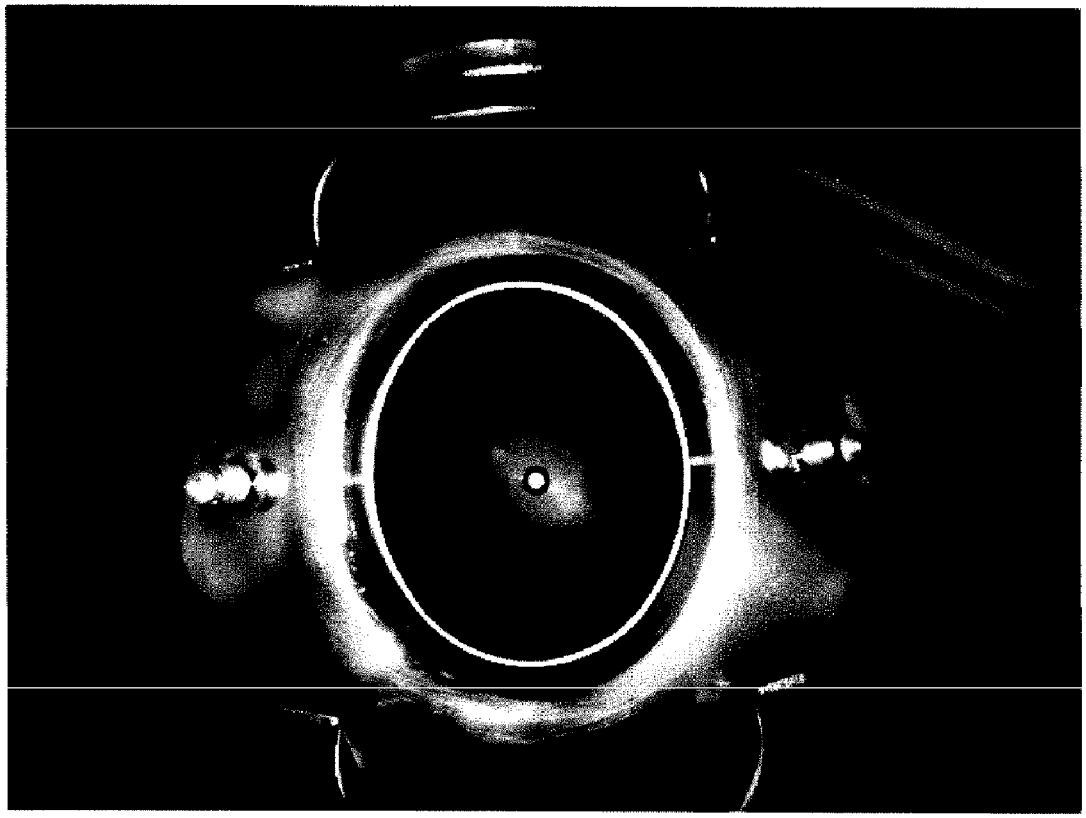

FIG. 8 shows a bulk container coated by the method according to the invention in frontal view. The container is still arranged in the coating chamber; the non-electrically conductive mount can be discerned in the lower region. In particular, the depression already discussed can be discerned in the region of the bottom of the container. It is furthermore readily discernible that the container has been coated with a DLC coating in the inner region, while the outer side of the container has not been coated (evident from the metallically lustrous surface composed of high-grade steel).

Figure 9:
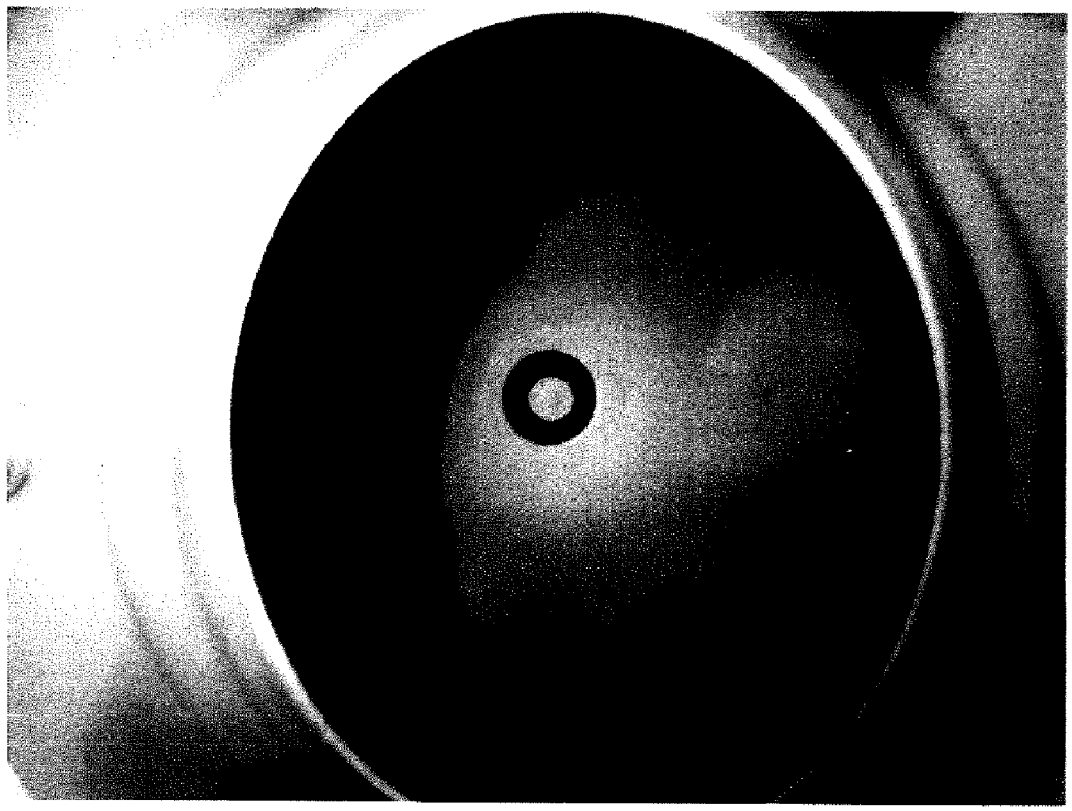

FIG. 9 shows the bottom of a bulk container coated by the method according to the invention in frontal view. Here, too, the depression already discussed can be discerned in the region of the bottom of the container. Here, too, on the basis of the different brightnesses it is once again readily discernible that the container has been coated with a DLC coating in the inner region, while the outer side of the container has not been coated (evident from the metallically lustrous surface composed of high-grade steel).

Figure 10:
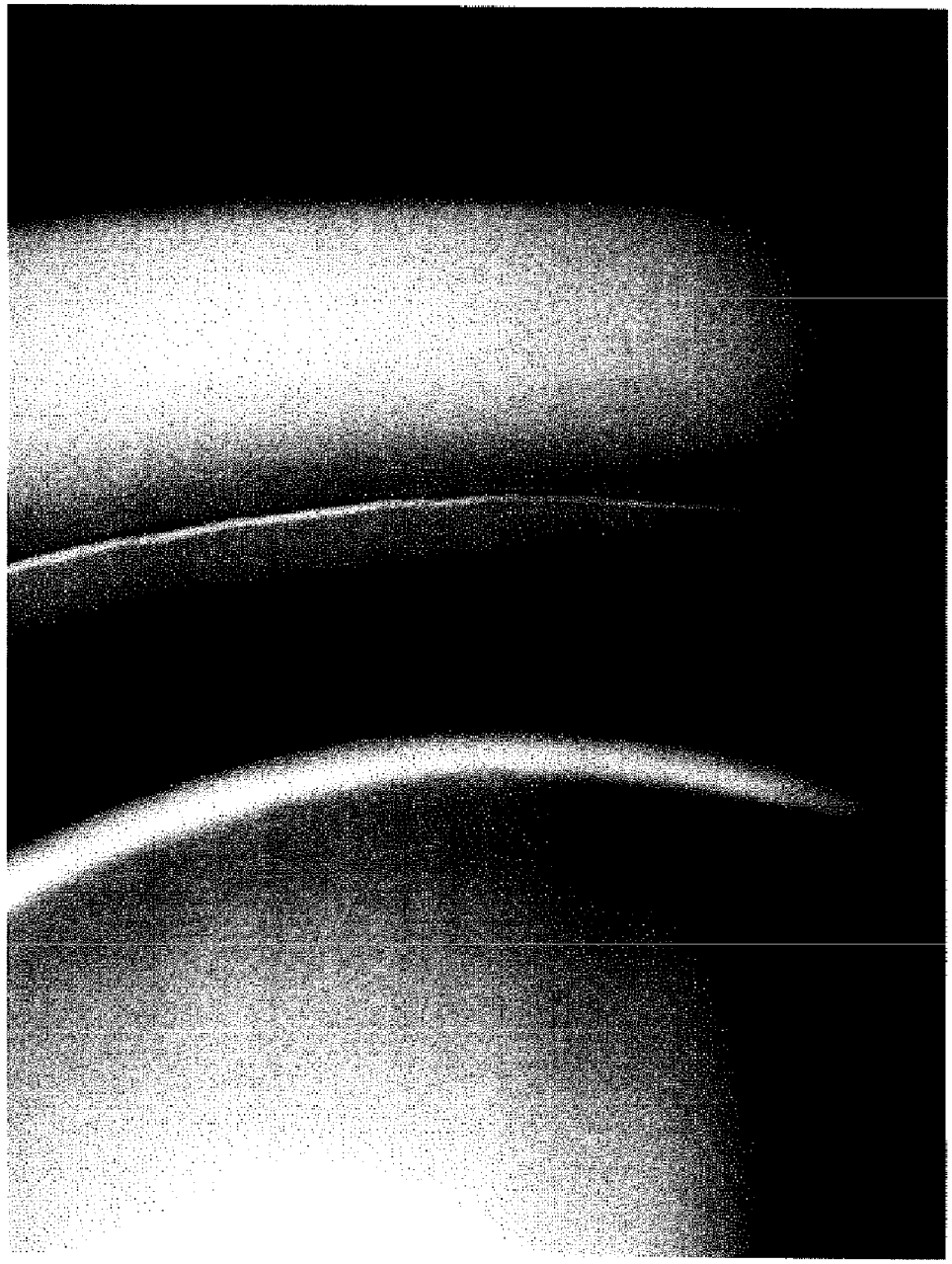

FIG. 10 shows the transition region between the bottom and the inner wall of a coated bulk container. In this case, it is in particular readily discernible that a welding seam arranged in the transition region has likewise been coated well.

The invention claimed is:

1. A method for plasma-assisted chemical vapour deposition for coating or material removal on the inner wall of a hollow body composed of a non-metallic material, having a cross-sectional area, a longitudinal extent, and at least one opening, comprising the following steps:
   introducing the hollow body to be treated on its inner side into a vacuum chamber having an earthed inner side, a large-area radio-frequency electrode being arranged in the interior of the vacuum chamber,
   positioning the hollow body in the centre of the vacuum chamber, it being necessary to comply with a minimum distance of 15 cm on all sides between the outer wall of the hollow body and the inner wall of the vacuum chamber,
   introducing a gas lance comprising a tube having an internal diameter of 0.001-10 mm, a maximum external diameter of 12 mm, and a terminal nozzle having a terminal opening diameter of 0.002-6 mm, through the at least one opening into the hollow body, the gas lance being connected to a gas feed unit via a non-electrically conductive gas line, the gas lance not being earthed and not being in electrically conductive contact with the radio-frequency electrode,
   positioning the gas lance in the hollow body in such a way that the gas lance is positioned centrally relative to the cross section of the hollow body and the terminal nozzle of the gas lance, relative to the longitudinal extent of the hollow body, is arranged in the region of the transition from the second longitudinal third to the third longitudinal third, measured from the at least one opening of the hollow body,
   closing the vacuum chamber and evacuating the latter to a residual pressure of 0.001-20 pascals,
   introducing a working gas and also one or a plurality of reaction gases via the gas feed unit and the gas lance into the hollow body, and
   igniting a cavity plasma to form a plasma cloud arranged at the tip of the gas lance, by applying an electric radio-frequency field to the radio-frequency electrode.

2. The method of claim 1, characterized in that the radio-frequency electrode in the interior of the vacuum chamber has at least two leads via which radio-frequency voltages can be fed into the radio-frequency electrode.

3. The method of claim 2, characterized in that the individual leads to the radio-frequency electrode are adjusted separately in such a way that a homogeneous alternating field having uniformly high field strengths can be generated in the entire chamber.

4. The method of claim 1, characterized in that said hollow body has an opening whose narrowest diameter is narrower than the narrowest diameter of the inner space of the hollow body.

5. The method of claim 1, characterized in that said hollow body has an internal volume $>0.1$ cm$^3$ and $<1,000,000$ cm$^3$.

6. The method of claim 1, characterized in that the working gas is selected from the group consisting of argon, helium, hydrogen, oxygen, or a noble gas.

7. The method of claim 1, characterized in that the reaction gas is oxygen.

8. The method of claim 1, characterized in that the reaction gas is a hydrocarbon gas or a silane gas.

9. The method of claim 1, characterized in that the plasma is ignited by applying a DC voltage radio-frequency field with the following parameters:
   frequency: 10 kHz -100 GHz
   electrical power: 500-5000 W.

10. The method of claim 1, characterized in that the amount of reaction gas introduced for the coating is 0.1-10 scm$^3$ of reaction gas per 10 cm$^2$ of inner surface to be coated.

11. The method of claim 1, characterized in that the reaction gas is doped with one or more gases containing Si, N, F, B, 0, Ag, Cu, V, or Ti.

12. The method of claim 2, characterized in that the individual leads to the radio-frequency electrode are adjusted separately in such a way that a homogeneous alternating field having uniformly high field strengths is generated in the entire chamber.

13. The method of claim 3, characterized in that said hollow body has an opening whose narrowest diameter is narrower than the narrowest diameter of the inner space of the hollow body.

14. The method of claim 2, characterized in that said hollow body has an opening whose narrowest diameter is narrower than the narrowest diameter of the inner space of the hollow body.

15. Device for carrying out a method according to claim 1, comprising
   a vacuum chamber with a radio-frequency electrode arranged at the bottom of the chamber, and with a mount for a hollow body to be coated on the inner side, a gas lance comprising a tube having an internal diameter of 0.001-10 mm, a maximum external diameter of 12 mm, and a terminal nozzle having a terminal opening diameter of 0.002-4 mm, which is connected to a gas feed unit via a non-electrically conductive line, the gas lance not being earthed and not being in electrically conductive contact with the radio frequency electrode, and
   a height-adjustable mount that can be used to ensure that the gas lance can be positioned in the hollow body in such a way
   that the gas lance is positioned centrally relative to the cross section of the hollow body and the nozzle of the gas lance, relative to the longitudinal extent of the hollow body, is arranged in the region of the transition from the second longitudinal third to the third longitudinal third, measured from the opening of the hollow body.

16. Device according to claim 15, characterized in that the radio-frequency electrode in the interior of the vacuum chamber has at least three leads via which radio-frequency voltages can be fed into the radio-frequency electrode.

17. Device according to claim 15, characterized in that the individual leads to the radio-frequency electrode can be adjusted separately in such a way that a homogeneous alternating field having uniformly high field strengths can be generated in the entire chamber.

18. Device according to claim 16, characterized in that the individual leads to the radio-frequency electrode can be adjusted separately in such a way that a homogeneous alternating field having uniformly high field strengths can be generated in the entire chamber.

* * * * *